(12) United States Patent
Lin et al.

(10) Patent No.: US 9,360,750 B2
(45) Date of Patent: Jun. 7, 2016

(54) BALANCING MASK LOADING

(71) Applicant: Taiwan Semiconductor Manufacturing Company Limited, Hsin-Chu (TW)

(72) Inventors: HungLung Lin, Hsinchu (TW); Chin-Chang Hsu, Banqiao (TW); Wen-Ju Yang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 22 days.

(21) Appl. No.: 14/300,152

(22) Filed: Jun. 9, 2014

(65) Prior Publication Data

US 2014/0289684 A1    Sep. 25, 2014

Related U.S. Application Data

(63) Continuation of application No. 13/656,045, filed on Oct. 19, 2012, now Pat. No. 8,751,978.

(60) Provisional application No. 61/695,651, filed on Aug. 31, 2012, provisional application No. 61/996,927, filed on May 19, 2014.

(51) Int. Cl.
*G06F 17/50* (2006.01)
*G03F 1/70* (2012.01)

(52) U.S. Cl.
CPC ................. *G03F 1/70* (2013.01)

(58) Field of Classification Search
CPC ............ G03F 1/144; G03F 1/36; G03F 1/70; G03F 7/70433; G03F 1/20; G03F 7/70441; G03F 7/70466; G03F 7/70425; G03F 17/50; G03F 17/5068; H01J 37/3174; H01J 2237/30455; H01J 2237/31769
USPC .............................. 716/50–55, 139; 430/5, 30
See application file for complete search history.

(56) References Cited

U.S. PATENT DOCUMENTS

| | | | | |
|---|---|---|---|---|
| 7,694,258 | B1 * | 4/2010 | Ylinen | H01L 21/76819 716/119 |
| 7,904,862 | B2 * | 3/2011 | Nequist | G06F 17/5081 716/111 |
| 8,418,111 | B2 * | 4/2013 | Chen | G06F 17/5077 716/119 |
| 8,516,404 | B1 * | 8/2013 | Cao | G03F 1/70 715/50 |
| 2006/0200790 | A1 | 9/2006 | Shang et al. | |

\* cited by examiner

*Primary Examiner* — Nghia Doan
(74) *Attorney, Agent, or Firm* — Cooper Legal Group, LLC

(57) ABSTRACT

Among other things, techniques for balancing mask loading are provided for herein. In some embodiments, one or more windows are defined within a layout. Based upon polygons comprised within respective windows, a localized mask loading is computed for the layout. In some embodiments, a global mask loading is also computed for the layout. Using the localized mask loading and the global mask loading, if computed, a loading effect of a plurality of mask pattern schemes is evaluated to identify a mask pattern scheme having a desired loading effect.

20 Claims, 7 Drawing Sheets

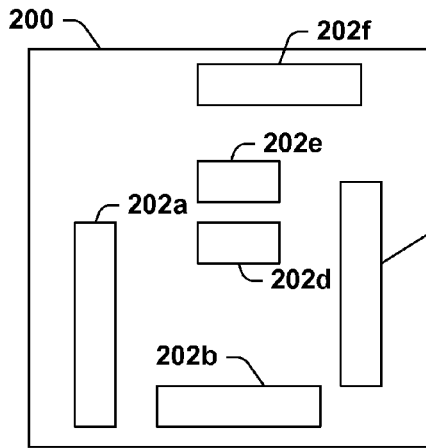
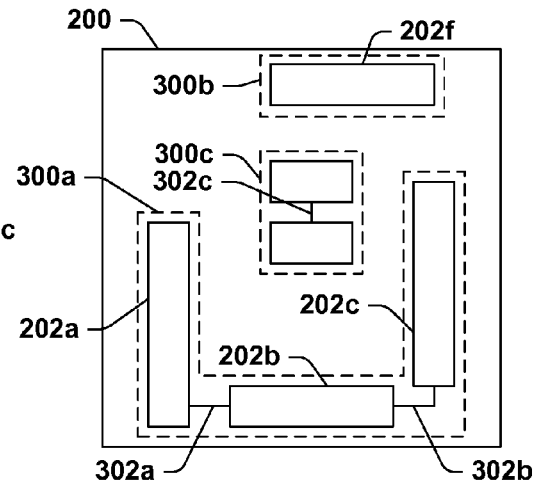
FIG. 2            FIG. 3
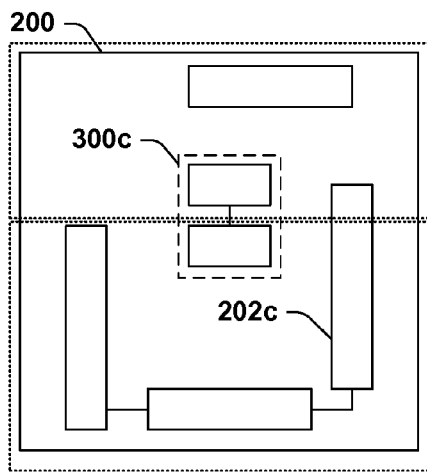
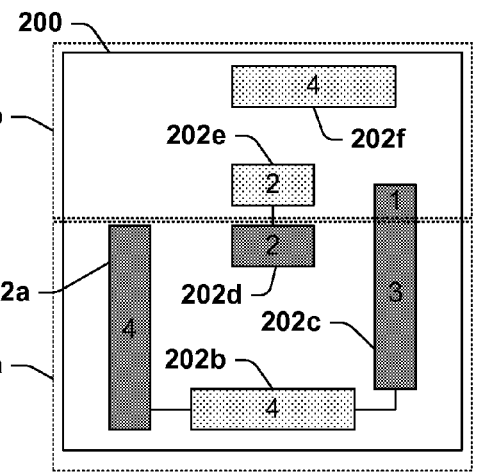
FIG. 4            FIG. 5
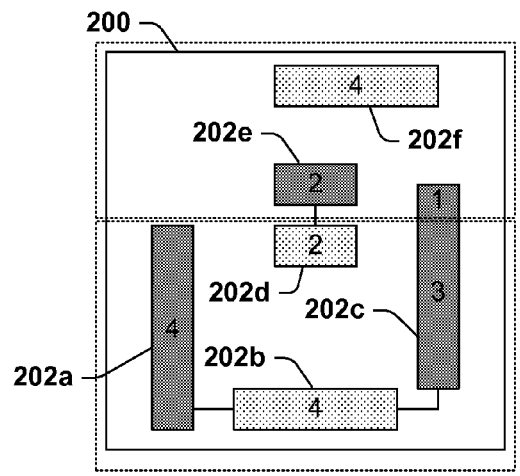
FIG. 6

BALANCING MASK LOADING

RELATED APPLICATION(S)

This application is a continuation-in-part of and claims benefit to U.S. patent application Ser. No. 13/656,045, filed on Oct. 19, 2012 and titled "BALANCING MASK LOADING," which is a non-provisional filing of U.S. Patent Application 61/695,651, filed on Aug. 31, 2012 and titled "BALANCING MASK LOADING." This application is also a non-provisional filing of U.S. Patent Application 61/996,927, filed on May 19, 2014 and titled "BALANCING MASK LOADING." U.S. patent applications Ser. Nos. 13/656,045, 61/695,651, and 61/996,927 are incorporated herein by reference.

BACKGROUND

Multiple patterning lithography (MPL) uses multiple masks to print layout geometries when forming a semiconductor device. Respective masks comprise one or more holes or transparencies that allow light to shine through in a defined pattern. The pattern of light is directed onto an underlying layer to form polygons of a layout geometry at least one of in, on, or from the underlying layer.

Mask loading refers to a distribution of holes across the multiple masks in MPL. An uneven distribution, also referred to as an unbalanced mask loading, refers to a situation where a total area of holes in a first mask is disproportionate to a total area of holes in a second mask such that a total area of polygons formed by the first mask is disproportionate to a total area of polygons formed by the second mask. Such uneven distribution is associated with process variation and a low yield, for example.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is an example layout, according to some embodiments.

FIG. 3 is an example layout wherein color nets have been identified, according to some embodiments.

FIG. 4 is an example layout wherein windows have been defined, according to some embodiments.

FIG. 5 is an example layout having a first mask pattern scheme applied thereto, according to some embodiments.

FIG. 6 is an example layout having a second mask pattern scheme applied thereto, according to some embodiments.

DETAILED DESCRIPTION

Figure 1:
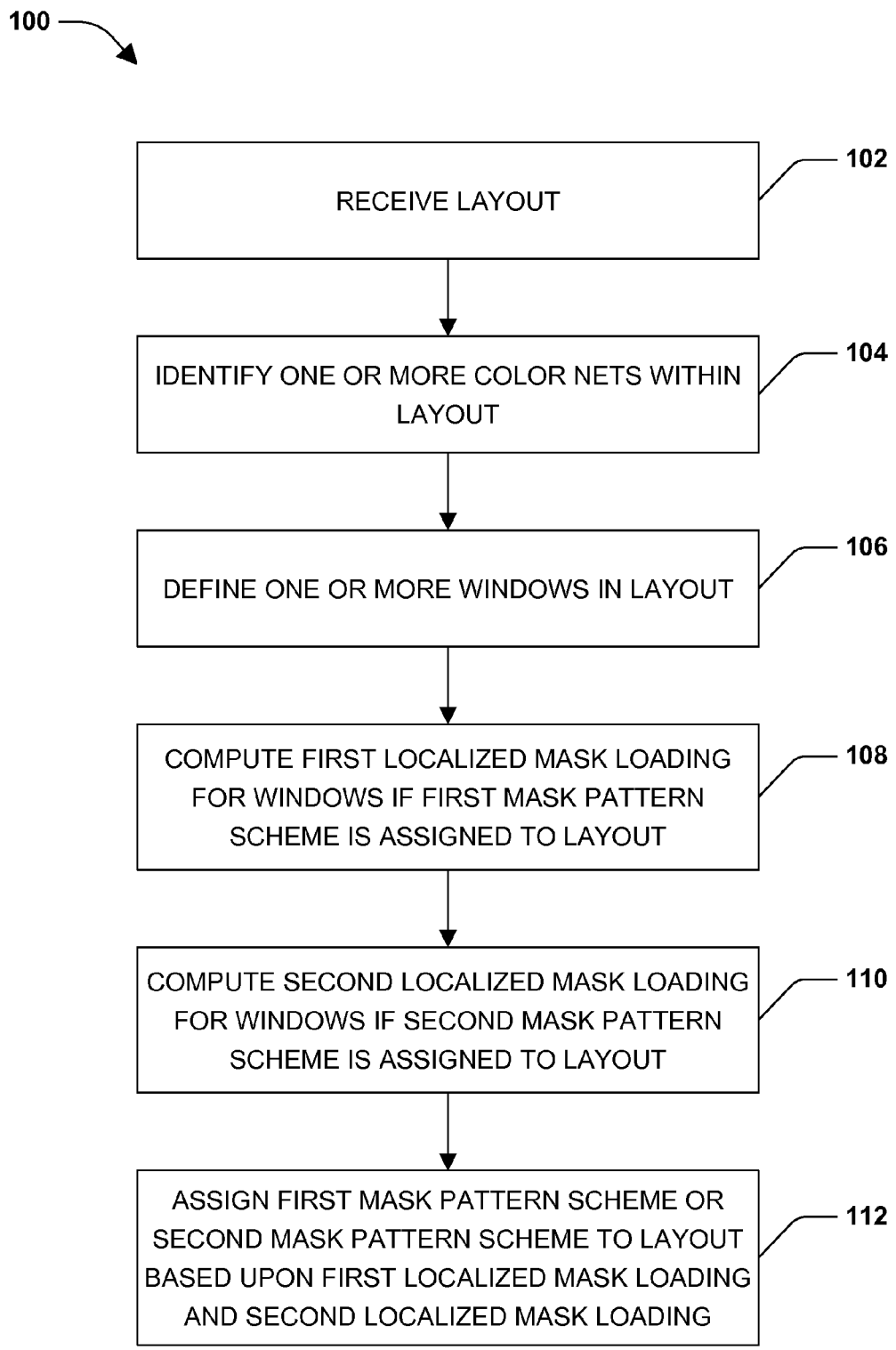
FIG. 1 is a flow diagram of an example method for assigning a mask pattern scheme to a layout, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Systems and techniques for balancing mask loading are provided. A load or mask load is used herein to refer to a distribution of polygons, in terms of area, across two or more masks. For a defined region, the mask load is zero or the load is balanced when an area of polygons, within the defined region, assigned to a first mask is equal to the area of polygons, within the defined region, assigned to respective other masks. For example, where polygons within a defined region are formed using two masks, the load is balanced when an area of polygons assigned to the first mask is equal to an area of polygons assigned to a second mask.

According to some embodiments, a design layout, also referred to as a layout or mask layout, is received. The layout describes the locations where a set of polygons are to be formed at least one of in, on, or from a layer of a semiconductor device, such as a metal layer, and is used to develop the masks by which the polygons are formed.

In some embodiments, two or more masks are used to form the set of polygons due to, among other things, the spatial relationship between polygons. For example, a distance between two polygons may be too small to provide for forming both polygons by a same mask. Accordingly, one of the polygons is formed using a first mask, and the other polygon is formed using a second mask. In a double patterning lithography process, respective polygons are assigned to one of two masks. In other multiple patterning lithography processes, more than two masks are used to form polygons.

In some embodiments, the layout is divided into a plurality of overlapping or non-overlapping windows to balance the load between masks. For respective windows, a degree of balance within the window is determined for respective mask pattern schemes, where a mask pattern scheme refers to which polygons are formed by which masks. Based upon the degree of balance within respective windows, which is at times referred to as a localized balance or localized mask loading, a mask pattern scheme is selected for the layout and polygons are assigned to masks according to the mask pattern scheme. Further, in some embodiments, a degree of balance within the layout, as a whole, is determined for respective mask pattern schemes. In such embodiments, the degree of balance within the layout, which is at times referred to as a global balance or global mask loading, is also taken into consideration when selecting the mask pattern scheme.

Referring to FIG. 1, a method 100 for localized mask balancing is provided. FIGS. 2-6 are further provided to illustrate the acts described with respect to the method 100.

The method 100 comprises receiving a layout at 102, such as the layout 200 of FIG. 2. The layout 200 provides information regarding a set of polygons 202, such as 202a-202f, that are to be formed for a semiconductor device. Such information includes the location of respective polygons 202, dimensions of respective polygons 202, etc. In some embodiments, such information also includes a mask assignment for one or more polygons 202 detailing which mask or masks, of a plurality of masks, are to be used to form the one or more polygons. In the layout 200, none of the polygons have been pre-assigned to a mask, as indicated by the lack of fill within the polygons 202.

At 104 in the example method 100, one or more color nets are identified within the layout. A color net describes a dependency between polygons with respect to mask assignments. For example, the mask assignment for a polygon is dependent upon a mask assignment for another polygon because a distance between the polygons is less than a spacing threshold, and thus the polygons cannot be formed by a same mask. Therefore, if the polygon is to be formed by a first mask, the other polygon cannot be formed by the first mask.

Referring to FIG. 3, color nets 300, such as 300a-300c, are identified in the layout 200. Branches 302, such as 302a-302c, extend between polygons to illustrate dependencies between polygons. A first color net 300a comprises a first polygon 202a, a second polygon 202b, and a third polygon 202c, where a masking assignment for the second polygon 202b is dependent upon a masking assignment for the first polygon 202a as represented by a first branch 302a, and a masking assignment for the third polygon 202c is dependent upon a masking assignment for the second polygons 202b as represented by a second branch 302b. For example, a distance between the first polygon 202a and the second polygon 202b is less than the spacing threshold and thus the first branch 302a connects the two polygons 202a, 202b to indicate that the first polygon 202a and the second polygon 202b must be formed by different masks. As another example, a distance between the second polygon 202b and the third polygon 202c is less than the spacing threshold and thus the second polygon 202b must be formed using a different mask than the third polygon 202c. As evident by the lack of a branch connecting the first polygon 202a and the third polygon 202c, a spacing between the first polygon 202a and the third polygon 202c satisfies the spacing threshold. Therefore, the first polygon 202a and the third polygon 202c can be formed by the same mask.

In a double patterning lithography process, where two masks are available to form polygons, the polygons in a color net are assigned to masks in a flip-flopping order. For example, if the first polygon 202a of the first color net 300a is assigned to a first mask, the second polygon 202b is assigned to a second mask and the third polygon 202c is assigned to the first mask. If the first polygon 202a is assigned to the second mask, the second polygon 202b is assigned to the first mask and the third polygon 202c is assigned to the second mask.

As further illustrated by FIG. 3, a mask assignment for a polygon is not necessarily dependent upon the mask assignment for another polygon. For example, a second color net 300b comprises merely one polygon 202f because the mask assignment for the polygon 202f is not dependent upon the mask assignments of other polygons.

While the method 100 describes identifying color nets as an action to be performed after the layout is received, in some embodiments, the received layout comprises the color nets. Accordingly, the action described at 104 is optional in some embodiments.

At 106 in the example method 100, one or more windows are defined in the layout. The windows respectively define a localized region of the layout and are used to compute a window mask loading on a region-by-region basis. Properties of the windows, such as shape, size, position relative to the layout, etc. can be pre-defined, selected at random, manually defined by a user when viewing the layout, selected as a function of the semiconductor device, etc. For example, in some semiconductor devices, performance deviations within a first region are more tolerable than performance deviations within a second region. Accordingly, windows can be defined to focus on the first region to provide finer granularity in regards to mask balancing in one region as compared to another region, in some embodiments.

Referring to FIG. 4, the layout is illustrated as having windows 400, such as 400a and 400b, imposed thereon. Respective windows 400 define a region of the layout 200. For example, a first window 400a defines a bottom region of the layout 400 and a second window 400b defines a top region of the layout 400. In the illustration, the windows 400 are non-overlapping. However, in some embodiments, at least one window overlaps another window. Moreover, while the illustration provides for having windows imposed over substantially the entire region, in some embodiments, at least some portions of the layout are not comprised within a window.

In some embodiments, the windows dissect a color net or dissect a polygon. For example, in FIG. 4, a portion of a third color net 300c is situated within the first window 400a and another portion of the third color net 300c is situated within the second window 400b. As another example in FIG. 4, a portion of the third polygon 202c is situated within the first window 400a and another portion of the third polygon 202c is situated within the second window 400b. In still other embodiments, the windows are shaped to at least one of avoid dissecting a color net or avoid dissecting a polygon.

In some embodiments, one or more windows are sized differently than one or more other windows, and thus an area of the layout defined by a first window, such as the first window 400a, is larger than an area of the layout defined by a second window, such as the second window 400b. In other embodiments, the windows are substantially uniformly sized and thus the area defined by respective windows is substantially equal.

At 108 in the example method 100, a first localized mask loading is computed to determine a localized balance if a first mask pattern scheme is assigned to a layout. The first localized mask loading is indicative of the degree of balance in the first window and the degree of balance in the second window if the polygons are assigned to the masks according to the first mask pattern scheme.

By way of example, referring to FIG. 5, the layout 200 is illustrated having imposed thereon the windows 400 defined at 106 in the example method 100. Polygons have been assigned to a mask based upon the first mask pattern scheme. For example, according to the first mask pattern scheme, a first subset of polygons 202a, 202c, and 202d, represented by the darkened pattern, is to be formed by a first mask and a second subset of polygons 202b, 202e, and 202f, represented by the lightly dotted pattern, is to be formed by a second mask.

To further illustrate mask loading, a numerical value has been inserted into respective polygons to provide an example area of respective polygons. The area corresponds to a load the polygon places on a mask that forms the polygon. For example, the first polygon 202a places a load of 4 units on the first mask. As another example, the second polygon 202b places a load of 4 units on the second mask. As another example, the third polygon 202c places a load of 4 units, divided across two windows 400a and 400b, on the first mask.

To compute a localized mask loading for the plurality of windows, a window mask loading for respective windows is computed. The window mask loading corresponds to a degree of balance in a window. For example, to compute the window mask loading for the first window 400a, the total area of polygons assigned to the second mask within the first window 400a is subtracted from the total area of polygons assigned to the first mask within the first window 400a. Thus, in the instant example, the window mask loading for the first window 400a would equal 5 units (4+2+3−4) for the first mask pattern scheme. To compute the window mask loading for the second window 400b, the total area of polygons assigned to the second mask within the second window 400b is subtracted from the total area of polygons assigned to the first mask within the first window 400b. Thus, in the instant example, the window mask loading for the second window 400b would equal −5 units (1−2−4) for the first mask pattern scheme. In some embodiments, the window mask loading for respective windows is expressed in absolute values and thus the first window 400a and the second window 400b would respectively have a window mask loading equal to 5 units.

In some embodiments, the localized mask loading is computed based upon the first window mask loading and the second window mask loading. For example, the absolute value of the first window mask loading for the first window 400a is summed with the absolute value of the second window mask loading for the second window 400b to yield a first localized mask loading of 10 units (5+5) for the first mask pattern scheme.

At 110 in the example method 100, a second localized mask loading is computed to determine a localized balance if a second mask pattern scheme is assigned to the layout. The second localized mask loading is indicative of the degree of balance in the first window and the degree of balance in the second window if the polygons are assigned to the masks according to the second mask pattern scheme.

By way of example, referring to FIG. 6, the polygons have been assigned to masks based upon the second mask pattern scheme. According to the second mask pattern scheme, a third subset of polygons 202a, 202c, and 202e is to be formed by the first mask and a fourth subset of polygons 202b, 202d, and 202f is to be formed by the second mask.

Due to the difference in assignments between the first mask pattern scheme and the second mask pattern scheme, the window masking loading for one or more windows can differ between the first mask pattern scheme and the second mask pattern scheme. By way of example, the first window mask loading for the first window 400a is equal to 1 unit (4+3−4−2) for the second mask pattern scheme as opposed to 5 units for the first mask pattern scheme. As another example, the window mask loading for the second window 400b is equal to −1 units (2+1−4) for the second mask pattern scheme as opposed to −5 units for the first mask pattern scheme.

The difference in assignments between the first mask pattern scheme and the second mask pattern scheme can also cause a difference in the localized mask loading. For example, the second localized mask loading for the second mask pattern scheme would equal 2 units (|1|+|−1|) as opposed to 10 units for the first mask pattern scheme.

At 112 in the method 100, the first mask pattern scheme or the second mask pattern scheme is assigned to the layout based upon the first localized mask loading and the second localized masking loading. By way of example, in some embodiments, the closer a localized mask loading is to zero, the higher the degree of balance when viewed on a window-by-window basis. Accordingly, the first mask pattern scheme is assigned to the layout when the first localized mask loading is less than the second localized mask loading, and thus closer to zero. Conversely, the second mask pattern scheme is assigned to the layout when the second localized mask loading is less than the first localized mask loading.

In some embodiments, the acts of computing a first localized mask loading, computing a second localized mask loading, and assigning are performed according to the following equation:

$$\min \Sigma_{i=1}^{n} \Delta w_i \quad (1)$$

where n equals the number of windows and $\Delta w_i$ equals the window mask loading for window $w_i$.

According to such an equation $\Sigma_{i=1}^{n} \Delta w_i$ is the localized mask loading for a given mask pattern scheme and min $\Sigma_{i=1}^{n} \Delta w_i$ is equal to the minimum localized mask loading that is possible for the layout.

While the method 100 merely compares the localized mask loadings of two mask pattern schemes, the number of comparisons is greater than two in some embodiments. For example, in some embodiments, the number of possible mask pattern schemes is a function of a number of color nets identified in the layout, and a localized mask loading is computed for respective mask pattern schemes. Accordingly, in some embodiments, the number of mask loadings that is compared at 112 is a function of the number of possible mask pattern schemes, which is a function of a number of color nets within the layout.

In some embodiments, balancing the mask load within a first region of a layout is more important than balancing the mask load within a second region of the layout. In such embodiments, a weighting factor is applied to respective windows based upon the importance of balancing the mask load within the region. For example, if a region represented by a first window is more sensitive to an imbalance between masks than a region represented by a second window, then a weighting factor of two, for example, is applied to a first window mask loading for the first window and a weighting factor of one, for example, is applied to a second window mask loading for the second window. In this way, the localized mask loading is more heavily impacted by the first window mask loading than by the second window mask loading.

As an example, returning to the second mask pattern scheme illustrated by FIG. 6, the first window mask loading for the first window equaled 1 unit and the second window mask loading for the second window equaled −1 units. If balancing a region represented by the first window is more important than balancing a region represented by the second window, the first window mask loading can be assigned a weight of 2 while the second window mask loading is assigned a weight of 1. Accordingly, the localized mask loading for the second mask pattern scheme would equal 3 units (2*|1|+1*|1|), where the first window mask loading has a greater impact on the value of the localized mask loading than the second window mask loading.

In some embodiments, where windows are weighted differently, equation 1 is modified as follows:

$$\min \Sigma_{i=1}^{n}(wt_i * \Delta w_i) \qquad (2)$$

where $wt_i$ represents a weighting factor of window $w_i$.

While the method 100 considers localized mask loading by computing the loading on a window-by-window basis, in some embodiments, a global mask loading of the layout, as a whole, is also taken into consideration when selecting a desired mask pattern scheme. Thus the layout having the lowest localized mask loading is not selected in some embodiments.

By way of example, referring to FIG. 6, the second localized mask loading for the second mask pattern scheme equaled 2 units. However, when the layout is considered as a whole, by finding the difference between an area for polygons assigned to the first mask and an area for polygons assigned to the second mask, the global mask loading is 0 units (4+3+1+2-4-2-4).

To take into consideration the global balance, also referred to as the global mask loading, equation 1 is modified as follows:

$$\min(\Sigma_{i=1}^{n} w_i) + (\Sigma_{j=1}^{m} \text{area(Chip)}) \qquad (3)$$

where m equals the number of color nets identified within the layout and area(Chip) is equal to a difference between an area of polygons assigned to the first mask and an area of polygons assigned to the second mask within the layout.

In some embodiments, there is a preference to weight localized balance over global balance, and thus the localized masking loading is assigned a weight that is greater than the global mask loading when determining a loading effect of a mask pattern scheme. In other embodiments, there is a preference to weight global balance over localized balance, and thus the global mask loading is assigned a weight that is greater than the localized mask loading when determining a loading effect of a mask pattern scheme. A loading effect, at times, refers to the value that is computed when the global mask loading is combined with the localized mask loading to determine a degree of balance that a mask pattern scheme offers.

In some embodiments, where consideration is given for weighting localized balance over global balance or vice-versa, equation 3 is modified as follows:

$$\min(W_{LB} * \Sigma_{i=1}^{n} \Delta w_i) + (W_{GB} * \Sigma_{j=1}^{m} \text{area(Chip)}) \qquad (4)$$

where $W_{LB}$ represents a weight assigned to the localized balance and $W_{GB}$ represents to a weight assigned to the global balance.

Figure 7:
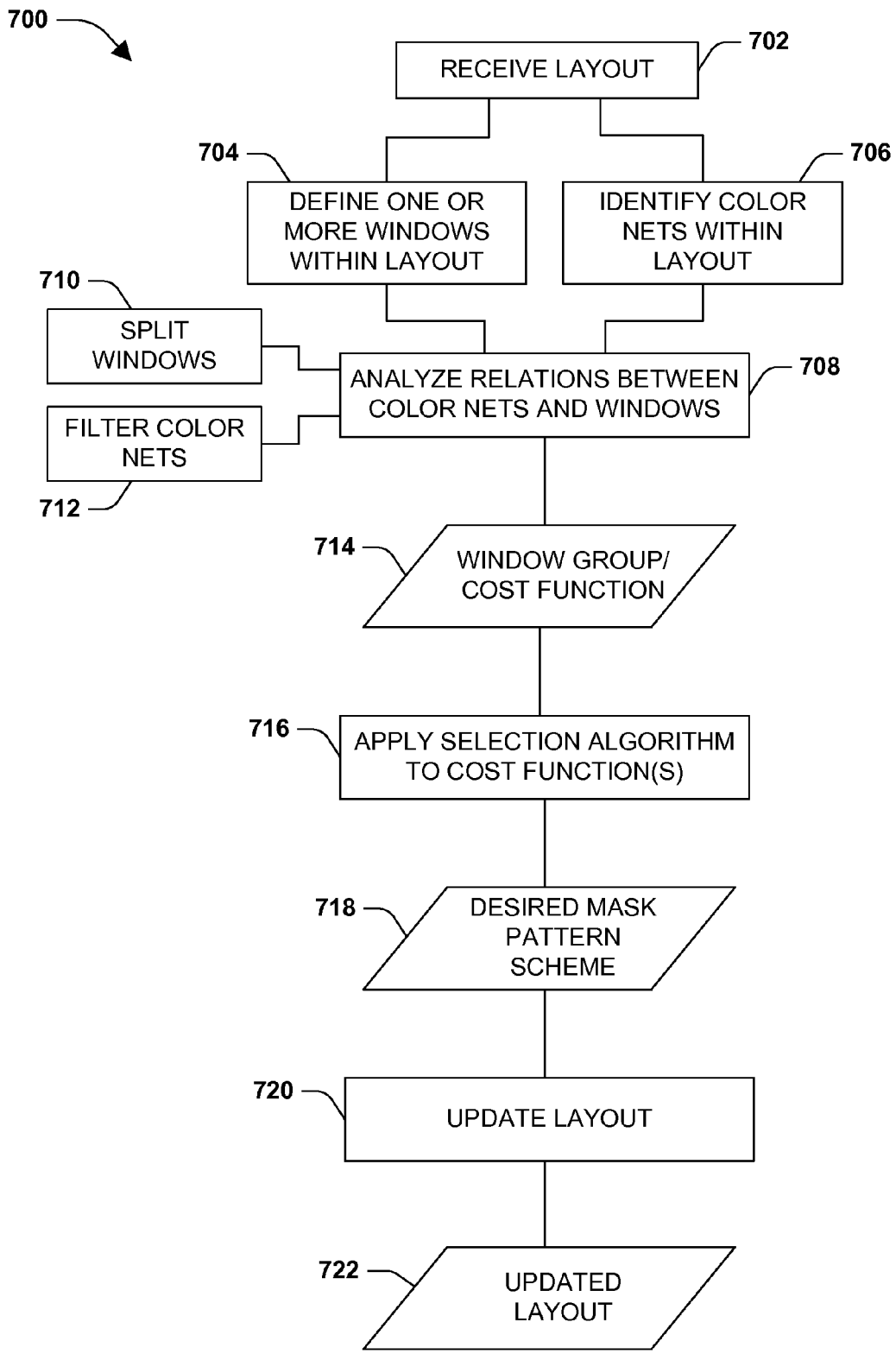
FIG. 7 is a flow diagram of an example method for assigning a mask pattern scheme to a layout, according to some embodiments.

Referring to FIG. 7, a method 700 for balancing mask loading according to some embodiments is provided. For purposes of brevity, acts of method 100 that are also included in the method 700 are not further described in detail.

At 702, a layout is received. The layout indicates the placement and area of one more polygons to be formed for a semiconductor device. In some embodiments, at least some of the polygons are pre-assigned to specific masks and are thus expected to be formed using those masks. In other embodiments, none of the polygons are pre-assigned to specific masks.

One or more windows are defined within the layout at 704 and one or more color nets are identified at 706 in the example method 700. In some embodiments, defining the windows and identifying the color nets are performed in series. In some embodiments, defining the windows and identifying the color nets are performed in parallel. In some embodiments, the color nets are identified prior to receiving the layout and thus the act of identifying color nets at 706 is not performed.

At 708 in the example method 700, a relationship between the color nets and the windows is analyzed to determine a cost function for the layout, where the cost function is based upon equations (1)-(4) above depending upon at least one of whether it is desirable to weight some windows differently than other windows, whether a global mask loading is taken into consideration, or whether a global mask loading is weighted differently than a localized mask loading.

Figure 8:
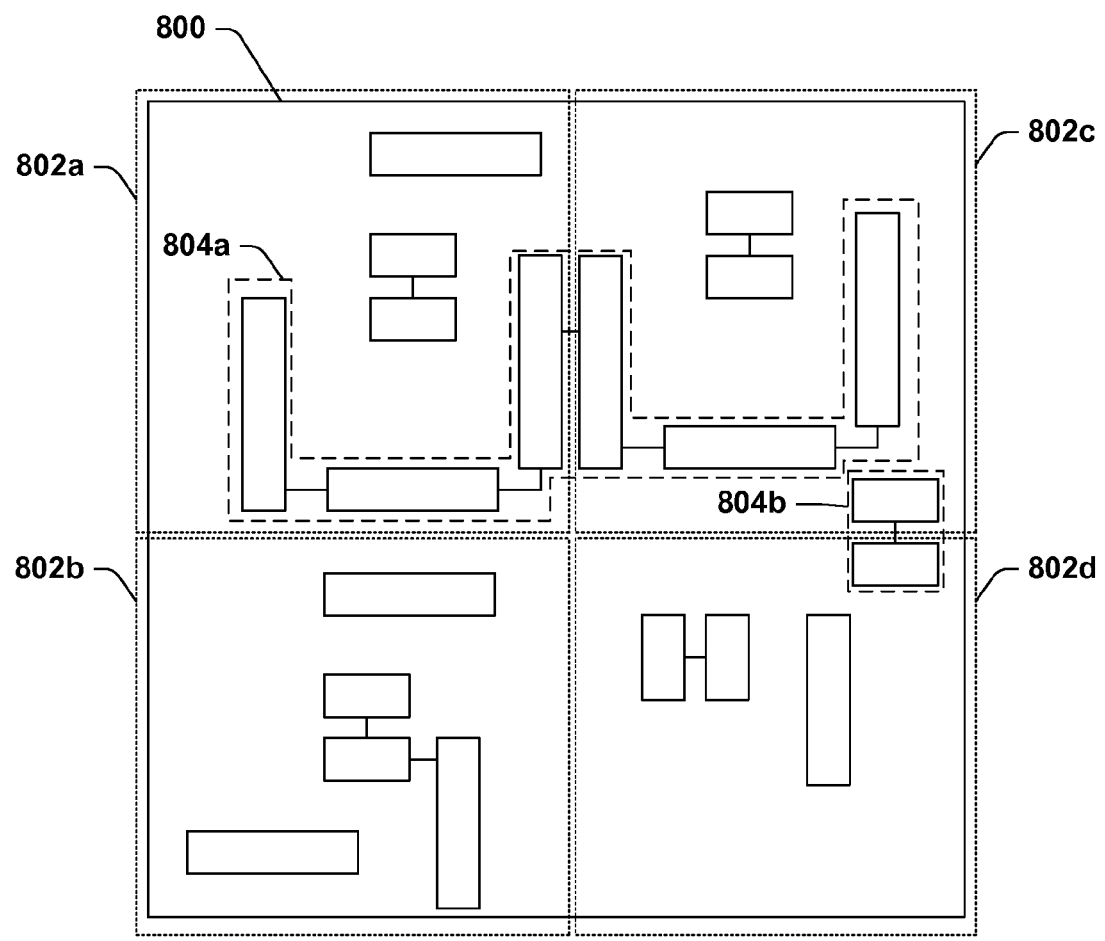
FIG. 8 is an example layout wherein color nets have been identified, according to some embodiments.

In some embodiments, to reduce the computational cost of determining a desired mask pattern scheme when a multitude of schemes are available, one or more computation reducing procedures are applied while the relationship between the color nets and the windows is analyzed at 708. By way of example, in some embodiments, a window splitting technique is performed at 710 to reduce the number of color nets within a layout. Window splitting refers to grouping windows and treating respective groups of windows as a different layout. A group of windows generally corresponds to windows that share one or more color nets. By way of example, referring to FIG. 8, a second window 802b of a layout 800 can be separated from windows 802a, 802c, and 802d of the layout 800 and can be treated as a separate layout for purposes of determining a desired mask pattern scheme because no polygons of the second window 802b are part of a color net that extends into another window. The other three windows 802a, 802c, and 802d of the layout 800 are grouped together and analyzed together because a first color net 804a extends between the first window 802a and the third window 802c and because a second color net 804b extends between the third window 802c and the fourth window 802d.

In some embodiments, a color net filtering process is performed at 712 to reduce the number of color nets that are evaluated when computing a localized mask loading or a global mask loading. A color net filtering process refers to the filtering of color nets that contribute a similar mask load to a window regardless of the mask pattern scheme that is used. For example, if a color net is comprised of two polygons that are situated within a window, and the first polygon corresponding to an area of 4 units and the second polygon corresponding to an area of 4 units, then regardless of the scheme selected the color net will contribute a mask load of 0 units to the window. Accordingly, using the color net filtering process, such a color net is filtered out of the layout for purposes of determining a desired mask pattern scheme.

A result 714 of the analyzing at 708 is one or more window groups, if window splitting has been applied, and a corresponding cost function providing an equation for determining a desired mask pattern scheme.

At 716 in the example method 700, a selection algorithm is applied to determine a mask pattern scheme for respective window groups, or to the layout when window splitting has not been applied, to determine a desired mask pattern scheme for respective window groups or for the layout. For example, in some embodiments, the selection algorithm is configured to identify the mask pattern scheme that results in the lowest loading effect when consideration is given to localized mask loading, weighted or non-weighted, and global mask loading, weighted or non-weighted. Example algorithms include integer linear programming, dynamic programming, simplex algorithm, combinatorial algorithms, quasi-Newton algorithms, conjugate gradient algorithms, interior point algorithms, gradient descent algorithms, sub gradient algorithms, bundle method of descent algorithms, ellipsoid method algorithms, reduced gradient method algorithms, simultaneous perturbation stochastic approximation algorithms, pattern search algorithms, memetic algorithms, differential evolution algorithms, differential search algorithms, dynamic relaxation algorithms, simulated annealing algorithms, genetic algorithms, hill climbing algorithms, Nelder-Mead simplicial heuristic algorithms, particle swarm optimization algorithms, artificial bee colony optimization algorithms, tabu search algorithms, reactive Search optimization algorithms, etc.

A result 718 of the example selection algorithm that is applied at 714 is a mask pattern scheme for respective window groups or for the layout that achieves a desired loading effect, such as achieves the lowest loading effect when consideration is given to the localized mask loading and the global mask loading.

In some embodiments, if the layout remains unbalanced when the mask pattern scheme(s) selected by the selection algorithm is applied, the layout is updated at 720 to further balance the mask loading and an updated layout 722 is generated. In some embodiments, the layout is balanced using dummies that are inserted into one or more windows, such as described in U.S. patent application Ser. No. 13/656,045. In some embodiments, the updated layout is generated manually by a designer of the layout or an implementer of the layout. Example Application to Double Patterning Lithography Process FIGS. 9-12 illustrate how a cost function can be utilized to achieve a desired mask loading in a double patterning lithography situation. In a double patterning lithography process, equation (4) can be written more specifically as:

$$\min(W_{LB} * \Sigma_{i=1}^{n}(wt_i * \Delta w_i)) + (W_{GB} * |\Sigma_{j=1}^{m}(s_j * \text{area}(\text{Chip}, CN_j))|) \quad (5)$$

where $\Delta w_i = |\Sigma_{j=1}^{m}(s_j * \text{area}(w_i, CN_j))|$, $W_{LB}$ represents a weight applied to a local balance, $W_{GB}$ represents a weight applied to a global balance, $wt_i$ represents a weighting factor of window $w_i$, $\text{area}(w_i, CN_j)$ represents an area difference for a color net (CN) within the window $w_i$, $\text{area}(\text{Chip}, CN_j)$ represents an area difference for a color net (CN) within the layout, m is the number of color nets in the layout, n is number of windows in the layout, and $s_j$ is a color pattern of a color net.

The layout 900 in this example comprises three windows 902a, 902b, and 902c. The third window 902c overlaps the first window 902a and the second window 902b. For purposes of this example, assume the first window 902a is weighted twice as much as the second window 902b and the third window 902c. Moreover, assume that localized mask loading is weighted three times more than global mask loading.

Figure 9:
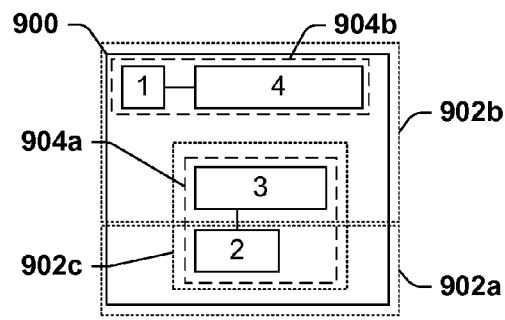
FIG. 9 is an example layout, according to some embodiments.

The layout 900 comprises two color nets 904a and 904b. The possible mask pattern schemes for the layout are illustrated by FIGS. 10-13. Referring to FIG. 9, a numerical value has been inserted into respective polygons to provide an example area of respective polygons. The area corresponds to a load the polygon places on a mask that forms the polygon.

Using the following assumptions, an area difference within respective windows 902a-902c attributable to respective color nets 904a-904b is computed. For example, referring to FIG. 10, the area difference for a first portion of the first color net 904a, comprised within the first window 902a, is 2 units (2−0); the area difference for a second portion of the first color net 904a, comprised within the second window 902b, is −3 units (0−3); and the area difference for a third portion of the first color net 904a, comprised within the third window 902c, is −1 units (2−3). With respect to the second color net 904b, the area difference for a first portion of the second color net 904b, comprised within the second window 902b, is 3 units (4−1). The second color net 904b is not situated within the first window 902a or the third window 902c and thus does not contribute to the first window 902a or the third window 902c. These calculations stay constant regardless of the mask pattern selected as will be seen in the follow paragraphs.

Figure 10:
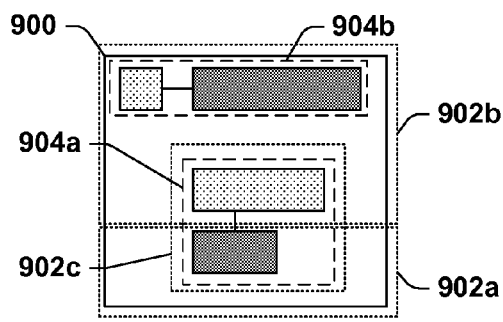
FIG. 10 is an example layout having a first mask pattern scheme applied thereto, according to some embodiments.
Figure 11:
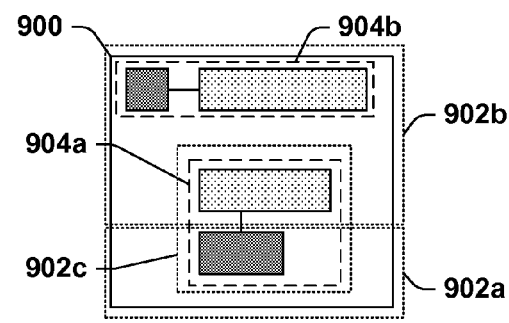
FIG. 11 is an example layout having a second mask pattern scheme applied thereto, according to some embodiments.
Figure 12:
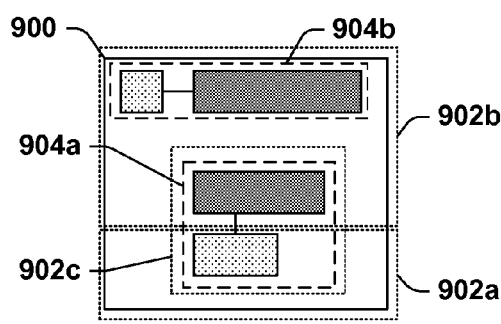
FIG. 12 is an example layout having a third mask pattern scheme applied thereto, according to some embodiments.
Figure 13:
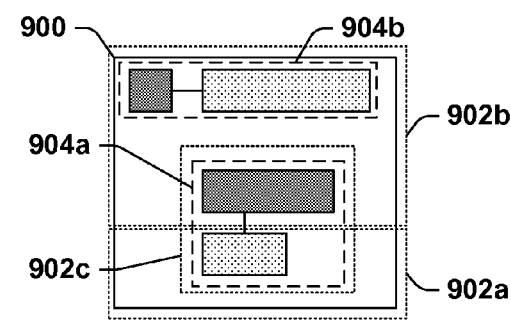
FIG. 13 is an example layout having a fourth mask pattern scheme applied thereto, according to some embodiments.

Additionally, a color pattern is assigned a value for respective mask pattern schemes for a color net. In a double pattern lithography process, where merely two mask pattern schemes are possible for a color net, a first mask pattern scheme is assigned +1 and a second mask pattern scheme is assigned −1 for respective color nets. By way of example, with respect to the first color net 904a, the mask pattern scheme illustrated in FIGS. 10 and 11 is assigned a +1 and the mask pattern scheme illustrated in FIGS. 12 and 13 is assigned a −1. With respect to the second color net 904b, the mask pattern scheme illustrated by FIGS. 10 and 12 is assigned a +1 and the mask pattern scheme illustrated in FIGS. 11 and 13 is assigned a −1.

For respective mask pattern schemes of a layout, the cost function is analyzed to find an overall loading effect for the mask pattern scheme when weighted according to the above referenced weighting scheme. For example, plugging into equation (5) values for a first mask pattern scheme illustrated by FIG. 10, the loading effect would be:

$$(3*(2*|1*2|+1*|(1*-3)+(1*3)|+1*|1*-1|))+(1*|(1*-1)+(1*3)|)=17$$

Plugging into equation (5) values for a second mask pattern scheme illustrated by FIG. 11, the loading effect would be:

$$(3*(2*|1*2|+1*|(1*-3)+(-1*3)|+1*|1*-1|))+(1*|(1*-1)+(-1*3)|)=37$$

Plugging into equation (5) values for a third mask pattern scheme illustrated by FIG. 12, the loading effect would be:

$$(3*(2*|-1*2|+1*|(-1*-3)+(1*3)|+1*|-1*-1|))+(1*|(-1*-1)+(1*3)|)=37$$

Plugging into equation (5) values for a fourth mask pattern scheme illustrated by FIG. 13, the loading effect would be:

$$(3*(2*|-1*2|+1*|(-1*-3)+(-1*3)|+*1*|-1*-1|))+(1*|(-1*-1)+(-1*3)|)=17$$

Accordingly, using equation (5) for the four mask pattern scheme, the four mask pattern schemes can be evaluated to determine a desired mask pattern scheme for the layout given the weighting of respective windows, weighting of the localized mask loading, and weighting of the global mask loading. In embodiments where a mask pattern scheme having a lowest value is selected, the first mask pattern scheme or the fourth mask pattern scheme could be selected because both the first mask pattern scheme and the fourth mask pattern scheme resulted in a final loading effect of 17 when the desired weights were applied.

While the foregoing example provides for identifying a desired mask pattern scheme for a double patterning lithography process where merely two masks are used, the techniques described herein also find applicability to multiple patterning lithography processes where more than two masks are used. For example, in a multiple patterning lithography process, equation (5) can be modified as follows to compute a loading effect when more than two masks are used:

$$\min(W_{LB} * \Sigma_{i=1}^{n}(wt_i * \Delta w_i)) + (W_{GB} * \text{area\_diff}(G_{CN}, G_S, \text{CHIP}))$$

where $\Delta w_i = \text{area\_diff}(G_{CN}, G_S, w_i)$, $W_{LB}$ represents a weight applied to a local balance, $W_{GB}$ represents a weight applied to a global balance, $wt_i$ represents a weighting factor of window $w_i$, $\Delta w_i$ represents a value of localized mask loading, $\text{area\_diff}(G_{CN}, G_S, w_i)$ represents an area difference for a group of color nets ($G_{CN}$) under their corresponding group of color patterns ($G_S$) within the window $w_i$, m is number of color nets in the layout, and n is number of windows in the layout.

Figure 14:
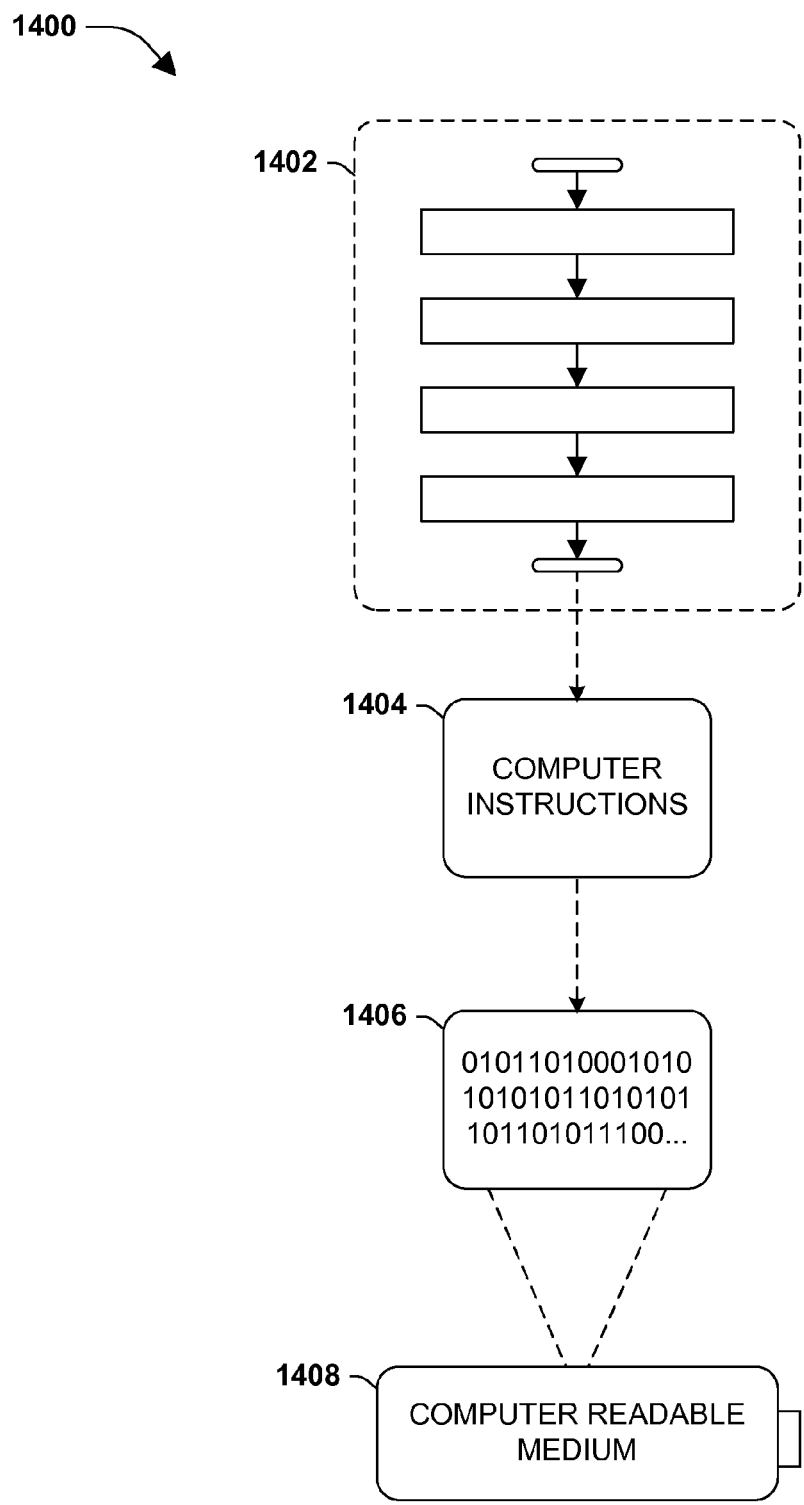
FIG. 14 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 14, wherein the implementation 1400 comprises a computer-readable medium 1408, such as a CD-R, DVD-R, flash drive, a platter of a hard disk drive, etc., on which is encoded computer-readable data 1406. This computer-readable data 1406, such as binary data comprising at least one of a zero or a one, in turn comprises a set of processor-executable instructions 1404 configured to operate according to one or more of the principles set forth herein when executed by a processor. In one such embodiment 1400, the processor-executable instructions 1404 are configured to perform a method 1402, such as at least some of at least one of the method 100 of FIG. 1 or the method 700 of FIG. 7. Many such computer-readable media are devised by those of ordinary skill in the art that are configured to operate in accordance with the techniques presented herein.

Figure 15:
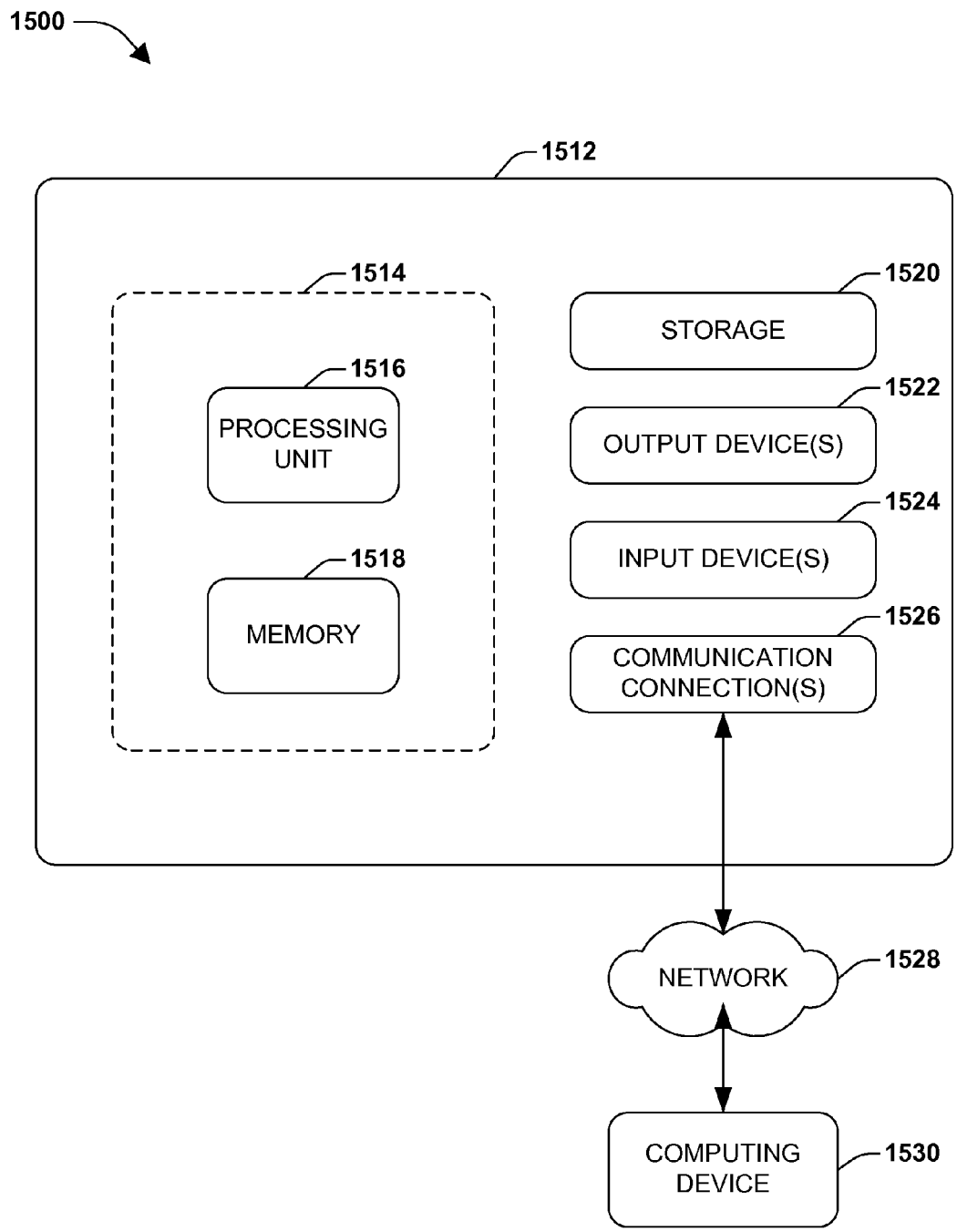
FIG. 15 is an illustration of an example computing environment where one or more of the provisions set forth herein are implemented, according to some embodiments.

FIG. 15 and the following discussion provide a brief, general description of a suitable computing environment to implement embodiments of one or more of the provisions set forth herein. The operating environment of FIG. 15 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 15 illustrates an example of a system 1500 comprising a computing device 1512 configured to implement one or more embodiments provided herein. In one configuration, computing device 1512 includes at least one processing unit 1516 and memory 1518. Depending on the exact configuration and type of computing device, memory 1518 may be volatile, such as RAM, non-volatile, such as ROM, flash memory, etc., or some combination of the two. This configuration is illustrated in FIG. 15 by dashed line 1514.

In some embodiments, device 1512 includes additional features or functionality. For example, device 1512 also includes additional storage such as removable storage or non-removable storage, including, but not limited to, magnetic storage, optical storage, and the like. Such additional storage is illustrated in FIG. 15 by storage 1520. In some embodiments, computer readable instructions to implement one or more embodiments provided herein are in storage 1520. Storage 1520 also stores other computer readable instructions to implement an operating system, an application program, and the like. Computer readable instructions are loaded in memory 1518 for execution by processing unit 1516, for example.

The term "computer readable media" as used herein includes computer storage media. Computer storage media includes volatile and nonvolatile, removable and non-removable media implemented in any method or technology for storage of information such as computer readable instructions or other data. Memory 1518 and storage 1520 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1512. Any such computer storage media is part of device 1512.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 1512 includes input device(s) 1524 such as keyboard, mouse, pen, voice input device, touch input device, infrared cameras, video input devices, or any other input device. Output device(s) 1522 such as one or more displays, speakers, printers, or any other output device are also included in device 1512. Input device(s) 1524 and output device(s) 1522 are connected to device 1512 via a wired connection, wireless connection, or any combination thereof. In some embodiments, an input device or an output device from another computing device are used as input device(s) 1524 or output device(s) 1522 for computing device 1512. Device 1512 also includes communication connection(s) 1526 to facilitate communications with one or more other devices.

According to some aspects, a method is provided. The method comprises receiving a layout comprising a set of polygons associated with a semiconductor device and defining a first window within the layout, a first subset of the set at least partially situated within the first window. The method also comprises defining a second window within the layout, a second subset of the set at least partially situated within the second window and computing a first localized mask loading for the first window and the second window if a first mask pattern scheme is assigned to the layout. The method also comprises computing a second localized mask loading for the first window and the second window if a second mask pattern scheme is assigned to the layout and assigning the first mask pattern scheme or the second mask pattern scheme to the layout based upon the first localized mask loading and the second localized mask loading.

According to some aspects, a method is provided. The method comprises receiving a layout comprising a set of polygons associated with a semiconductor device and defining a plurality of windows within the layout, a first subset of the set at least partially situated within a first window of the plurality. For a first mask pattern scheme, the method also comprises determining a first window mask loading for the first window and determining a first global mask loading for the layout. The method also comprises using the first window mask loading and the first global mask loading to evaluate a loading effect of the first mask pattern scheme on the layout.

According to some aspects, a method is provided. The method comprises receiving a layout comprising a set of polygons associated with a semiconductor device, defining a first window within the layout, a first subset of the set at least partially situated within the first window, and defining a second window within the layout, a second subset of the set at least partially situated within the second window. For a first mask pattern scheme, the method comprises computing a first window mask loading for the first window and computing a second window mask loading for the second window. For the first mask pattern scheme, the method also comprises applying a first window weight to the first window mask loading to yield a first weighted window mask loading and applying a second window weight to the second window mask loading to yield a second weighted window mask loading. For the first mask pattern scheme, the method also comprises summing the first weighted window mask loading and the second weighted window mask loading to yield a first localized mask loading, computing a first global mask loading for the layout, and summing the first localized mask loading and the first global mask loading to yield a first loading effect. For a second mask pattern scheme, the method comprises computing a third window mask loading for the first window and computing a fourth window mask loading for the second window. For the second mask pattern scheme, the method also comprises applying the first window weight to the third window mask loading to yield a third weighted window mask loading and applying the second window weight to the fourth window mask loading to yield a fourth weighted window mask loading. For the second mask pattern scheme, the method also comprises summing the third weighted window mask loading and the fourth weighted window mask loading to yield a second localized mask loading, computing a second global mask loading for the layout, and summing the second localized mask loading and the second global mask loading to yield a second loading effect. The method also comprises assigning the first mask pattern scheme or the second mask pattern scheme to the layout based upon the first loading effect and the second loading effect.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
receiving a layout comprising a set of polygons associated with a semiconductor device;
defining a first window within the layout, a first subset of the set of polygons at least partially situated within the first window;
defining a second window within the layout, a second subset of the set of polygons at least partially situated within the second window;
for a first mask pattern scheme describing a first assignment of the set of polygons to masks:
  computing a first localized mask loading for the first window and the second window;
for a second mask pattern scheme describing a second assignment of the set of polygons to the masks:
  computing a second localized mask loading for the first window and the second window;
assigning the first mask pattern scheme or the second mask pattern scheme to the layout based upon the first localized mask loading and the second localized mask loading, wherein a distribution of holes across the masks is specified by the first mask pattern scheme when the first mask pattern scheme is assigned to the layout and is specified by the second mask pattern scheme when the second mask pattern scheme is assigned to the layout; and forming the masks according to:
the first mask pattern scheme when the first mask pattern scheme is assigned to the layout; and
the second mask pattern scheme when the second mask pattern scheme is assigned to the layout.

2. The method of claim 1, wherein,
the first mask pattern scheme is assigned to the layout if the first localized mask loading is less than the second localized mask loading; and
the second mask pattern scheme is assigned to the layout when the second localized mask loading is less than the first localized mask loading.

3. The method of claim 1, the computing a first localized mask loading comprising:
for the first window:
computing a first area difference for a first portion of a first color net represented in the first window.

4. The method of claim 3, the computing a first localized mask loading comprising:
for the first window:
computing a second area difference for a first portion of a second color net represented in the first window; and
summing the first area difference and the second area difference to yield a first window mask loading.

5. The method of claim 4, the computing a first localized mask loading comprising:
for the second window:
computing a third area difference for a second portion of the first color net represented in the second window; and
summing the first window mask loading with the third area difference to yield the first localized mask loading.

6. The method of claim 1, the computing a first localized mask loading comprising:
computing a first window mask loading for the first window; and
computing a second window mask loading for the second window.

7. The method of claim 6, the computing a first localized mask loading comprising:
applying a first window weight to the first window mask loading to yield a first weighted window mask loading;
applying a second weight to the second window mask loading to yield a second weighted window mask loading; and
summing the first weighted window mask loading and the second weighted window mask loading to yield the first localized mask loading.

8. The method of claim 1, the first mask pattern scheme providing for assigning a first mask to a first portion of the first subset and assigning a second mask to a second portion of the first subset.

9. The method of claim 1, comprising:
computing a first global mask loading for the layout if the first mask pattern scheme is assigned to the layout; and
computing a second global mask loading for the layout if the second mask pattern scheme is assigned to the layout.

10. The method of claim 9, wherein the assigning is further based the first global mask loading and the second global mask loading.

11. The method of claim 1, wherein the first window at least partially overlaps the second window.

12. A method, comprising:
receiving a layout comprising a set of polygons associated with a semiconductor device;
defining a plurality of windows within the layout, a first subset of the set of polygons at least partially situated within a first window of the plurality of windows;
for a first mask pattern scheme describing a first assignment of the set of polygons to masks:
determining a first window mask loading for the first window; and determining a first global mask loading for the layout
using the first window mask loading and the first global mask loading to evaluate a loading effect of the first mask pattern scheme on the layout; and
forming the masks according to the first mask pattern scheme when the loading effect of the first mask pattern scheme is less than or equal to a loading effect of a desired mask pattern scheme.

13. The method of claim 12, comprising:
for a second mask pattern scheme:
determining a second window mask loading for the first window; and
determining a second global mask loading for the layout;
using the second window mask loading and the second global mask loading to evaluate a loading effect of the second mask pattern scheme;
comparing the loading effect of the first mask pattern scheme to the loading effect of the second mask pattern scheme; and
assigning the first mask pattern scheme or the second mask pattern scheme to the layout based upon the comparing.

14. The method of claim 12, the using comprising:
applying a window weight to the first window mask loading; and
applying a global weight to the first global mask loading.

15. The method of claim 12, comprising:
for the first mask pattern scheme:
determining a second window mask loading for a second window of the plurality, a second subset of the set at least partially situated within the second window, wherein the using comprises:
using the second window mask loading to evaluate the loading effect of the first mask pattern scheme.

16. The method of claim 15, the using comprising summing the first window mask loading and the second window mask loading to yield a first localized mask loading.

17. The method of claim 16, comprising, for the first mask pattern scheme:
determining a first global mask loading for the layout, wherein the using comprises:
summing the first localized mask loading and the first global mask loading to evaluate the loading effect of the first mask pattern scheme.

18. The method of claim 17, the using comprising, before the summing the first localized mask loading and the first global mask loading:
applying a localized weight to the first localized mask loading; and
applying a global weight to the first global mask loading.

19. A method, comprising:
receiving a layout comprising a set of polygons associated with a semiconductor device;
defining a first window within the layout, a first subset of the set of polygons at least partially situated within the first window;

defining a second window within the layout, a second subset of the set of polygons at least partially situated within the second window;

for a first mask pattern scheme:
- computing a first window mask loading for the first window;
- computing a second window mask loading for the second window;
- applying a first window weight to the first window mask loading to yield a first weighted window mask loading;
- applying a second window weight to the second window mask loading to yield a second weighted window mask loading;
- summing the first weighted window mask loading and the second weighted window mask loading to yield a first localized mask loading;
- computing a first global mask loading for the layout; and
- summing the first localized mask loading and the first global mask loading to yield a first loading effect;

for a second mask pattern scheme:
- computing a third window mask loading for the first window;
- computing a fourth window mask loading for the second window;
- applying the first window weight to the third window mask loading to yield a third weighted window mask loading;
- applying the second window weight to the fourth window mask loading to yield a fourth weighted window mask loading;
- summing the third weighted window mask loading and the fourth weighted window mask loading to yield a second localized mask loading;
- computing a second global mask loading for the layout; and
- summing the second localized mask loading and the second global mask loading to yield a second loading effect;

assigning the first mask pattern scheme or the second mask pattern scheme to the layout based upon the first loading effect and the second loading effect, wherein a distribution of holes across a set of masks is specified by the first mask pattern scheme when the first mask pattern scheme is assigned to the layout and is specified by the second mask pattern scheme when the second mask pattern scheme is assigned to the layout; and forming the masks according to:
- the first mask pattern scheme when the first mask pattern scheme is assigned to the layout; and
- the second mask pattern scheme when the second mask pattern scheme is assigned to the layout.

20. The method of claim 19, wherein the first window at least partially overlaps the second window.

* * * * *